US011714555B2

(12) United States Patent
Chang

(10) Patent No.: US 11,714,555 B2
(45) Date of Patent: Aug. 1, 2023

(54) CONTROL MODULE AND CONTROL METHOD THEREOF FOR SYNCHRONOUS DYNAMIC RANDOM ACCESS MEMORY

(71) Applicant: REALTEK SEMICONDUCTOR CORPORATION, Hsinchu (TW)

(72) Inventor: Ya-Min Chang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 14 days.

(21) Appl. No.: 17/376,155

(22) Filed: Jul. 15, 2021

(65) Prior Publication Data

US 2022/0206684 A1   Jun. 30, 2022

(30) Foreign Application Priority Data

Dec. 28, 2020   (TW) .................................. 109146547

(51) Int. Cl.
*G06F 3/06* (2006.01)

(52) U.S. Cl.
CPC ............ *G06F 3/061* (2013.01); *G06F 3/0659* (2013.01); *G06F 3/0673* (2013.01)

(58) Field of Classification Search
CPC ...... G06F 3/061; G06F 3/0659; G06F 3/0673; G11C 11/4096
See application file for complete search history.

(56) References Cited

U.S. PATENT DOCUMENTS

| 5,574,876 A * | 11/1996 | Uchiyama | G11C 7/1072 375/E7.094 |
| 6,138,177 A * | 10/2000 | Williams | H03K 19/1732 710/62 |
| 7,093,153 B1 * | 8/2006 | Witek | G06F 1/3203 710/110 |
| 10,089,232 B2 * | 10/2018 | Peng | G06F 13/409 |

OTHER PUBLICATIONS

Office Action, Cited Reference (U.S. Pat. No. 6,138,177) and Search Report dated Jun. 10, 2021 by the Taiwan Intellectual Property Office for the Taiwanese corresponding application No. 109146547. English Summary of the Office Action and Search Report dated Jun. 10, 2021 by the Taiwan Intellectual Property Office for the Taiwanese corresponding application No. 109146547.

* cited by examiner

*Primary Examiner* — Zhuo H Li
(74) *Attorney, Agent, or Firm* — WPAT, P.C., Intellectual Property Attorneys; Anthony King

(57) ABSTRACT

The present invention provides a control module and a control method thereof for an SDRAM. The control module includes at least one register and a controller. The controller is configured to: control the SDRAM to switch from a bus data access mode to a dynamic pin (DPIN) operating mode; setting value of the at least one register under the DPIN operating mode; and control the SDRAM according to the value of the at least one register.

16 Claims, 11 Drawing Sheets

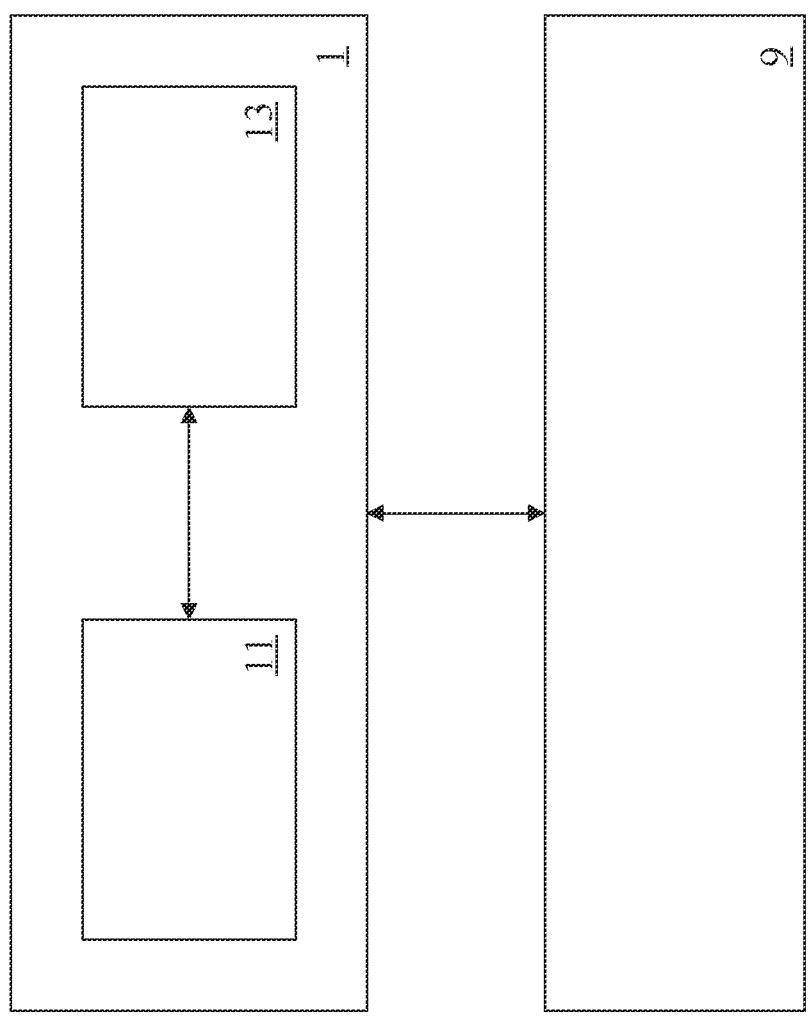

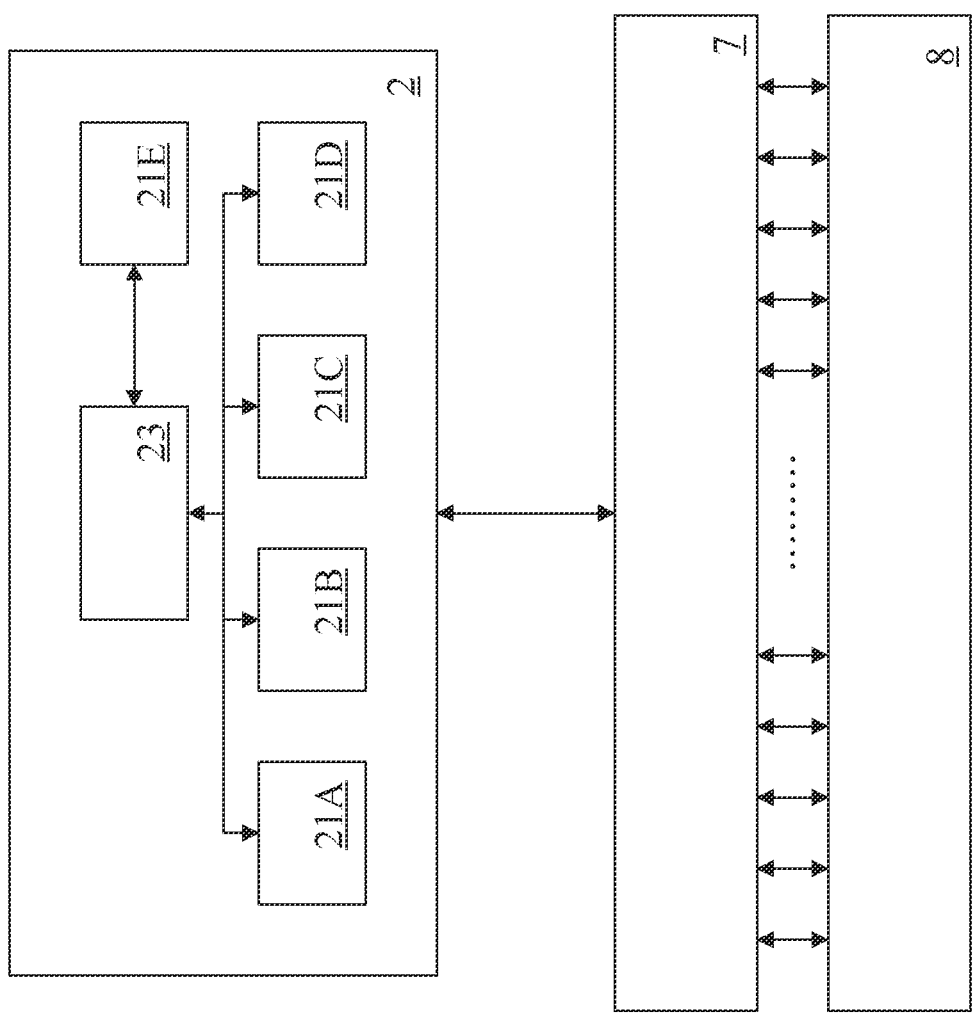

CONTROL MODULE AND CONTROL METHOD THEREOF FOR SYNCHRONOUS DYNAMIC RANDOM ACCESS MEMORY

CROSS REFERENCE TO RELATED APPLICATIONS

This application claims priority of Taiwan application No. 109146547 filed on Dec. 28, 2020, which is incorporated by reference in its entirety.

BACKGROUND

Field of the Invention

The present invention relates generally to a control module and a control method thereof for a memory, in particular, to a control module and a control method thereof for a synchronous dynamic random access memory (SDRAM).

Description of Related Art

In the synchronous dynamic random access memory (SDRAM) architecture, SDRAM controllers are employed to execute commands and control data channels. When manufacturing conventional SDRAM controllers, the SDRAM controllers are usually developed so that they can execute the required commands and specific functions. However, suppose the manufactured SDRAM controllers have any defects, flaws, or errors concerning the SDRAM's operation (especially those with special functions), it would be very challenging to verify or otherwise correct such defects, flaws, or errors.

BRIEF SUMMARY OF THE INVENTION

Some embodiments of the present invention provide a control method for a synchronous dynamic random access memory (SDRAM). The method includes: controlling the SDRAM to switch from a bus data access mode to a dynamic pin (DPIN) operation mode; setting a value of at least one register under the DPIN operation mode; and controlling the SDRAM according to the value of the at least one register.

Some embodiments of the present invention provide a control module for use in a SDRAM. The control module includes: at least one register and a controller. The at least one register is electrically connected to the SDRAM. The controller is electrically connected to the SDRAM and the at least one register and configured to: control the SDRAM to switch from a bus data access mode to a DPIN operation mode; set a value of at least one register under the DPIN operation mode; and control the SDRAM according to the value of the at least one register.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a block diagram illustrating a control module according to some embodiments of the present invention.

FIG. 2B is a block diagram illustrating a control module according to some embodiments of the present invention.

DETAILED DESCRIPTION

Embodiments of the present invention are discussed in detail below. It should be appreciated, however, that the present invention provides many applicable inventive concepts that can be embodied in a wide variety of specific contexts. The specific embodiments discussed are merely illustrative and do not limit the scope of the disclosure.

The use of the conventional synchronous dynamic random access memory (SDRAM) architecture lacks flexibility, and if there are any defects, flaws, or errors with respect to the SDRAM' operation (especially those with special functions), it would be very challenging to verify or otherwise correct such defects, flaws, or errors. The present disclosure provides a control module and a control method that can increase the SDRAM architecture's operational flexibility.

Please refer to FIG. 1, which is a block diagram illustrating a control module 1 according to some embodiments of the present disclosure. The control module 1 includes at least one register 11 and a controller 13, wherein the register 11 is electrically connected to the controller 13. The control module 1 is electrically connected to a synchronous dynamic random access memory (SDRAM) 9. Data and signals are transmitted among the components through the electrical connection. The related controlling operation is discussed in detail below.

In some embodiments, the SDRAM 9 is under a bus data access mode. In other words, the SDRAM 9 exchanges data with a device (e.g., a computer host) via a general bus. When special operation functions are required for SDRAM 9 (e.g., debugging, special command control, etc.), the controller 13 switches the SDRAM 9 from the bus data access mode to a dynamic pin (DPIN) operation mode based on user commands.

Under the DPIN operation mode, the user may use the controller 13 to set the value of at least one register 11. Then, after completing the setting of the value of the at least one register 11, the controller 13 controls the SDRAM 9 according to the value of the at least one register 11. More specifically, when the users want to execute a special command using the SDRAM 9, such special command often corresponds to at least one pin of the SDRAM 9. In other words, when at least one pin corresponding to the special command is triggered, the execution of the special command of the SDRAM 9 is completed.

Since different values of the at least one register 11 correspond to different pins or different pin combinations of SDRAM 9, users may fill in corresponding values in the at least one register 11 in advance with respect to the at least one pin that the special command corresponds to. In this way, after completing the setting of the value of the at least one register 11, the controller 13 can trigger a pin of the SDRAM 9 according to the value of the at least one register 11, so as to finish the execution of the special command of the SDRAM 9.

Figure 2A:
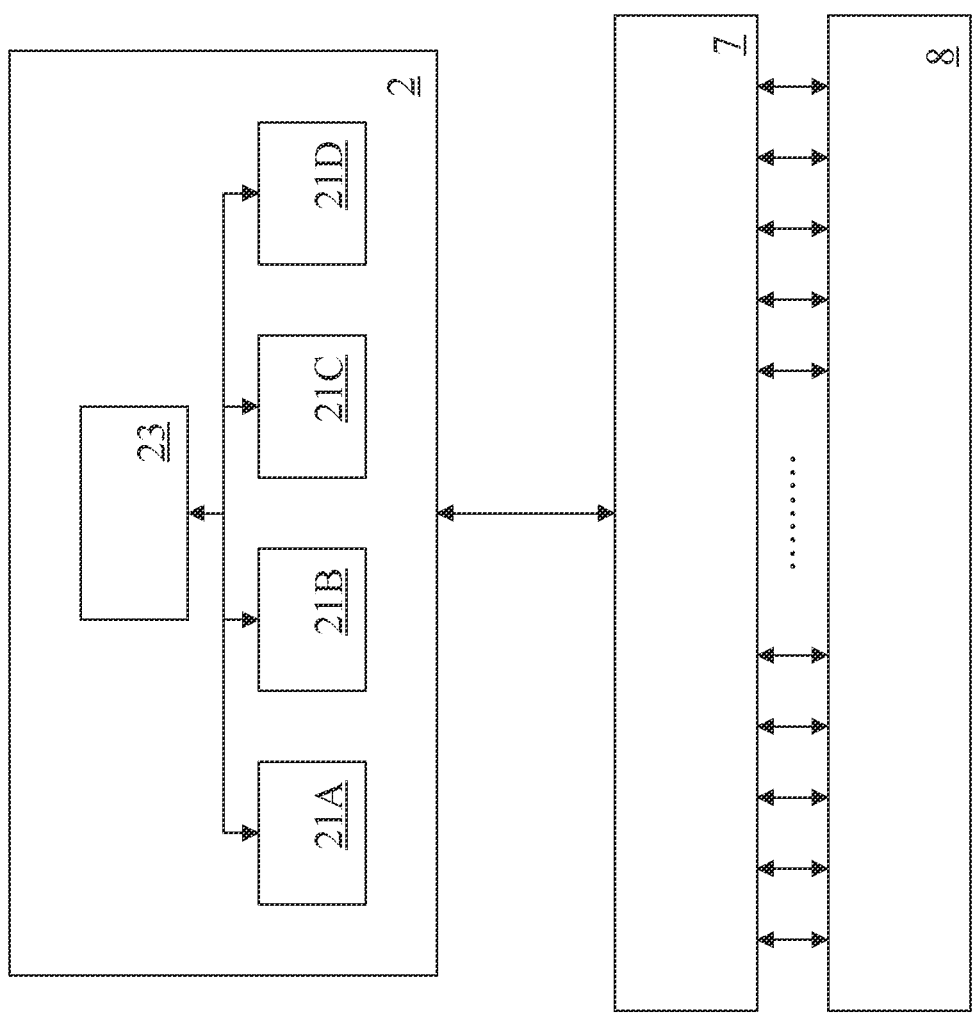
FIG. 2A is a block diagram illustrating a control module according to some embodiments of the present invention.

Please refer to FIG. 2A, which is a block diagram illustrating a control module 2 according to some embodiments of the present disclosure. The control module 2 includes a plurality of registers 21A to 21D and a controller 23. The registers 21A to 21D are electrically connected to the controller 23. In some embodiments, the value stored in the register 21A corresponds to a pin associated with tied command of the SDRAM 8. The value stored in the register 21B corresponds to a pin associated with synchronization command of the SDRAM 8. The value stored in the register 21C corresponds to data to be written into the SDRAM 8. The register 21D is configured to store the data read from the SDRAM 8.

The control module 2 is electrically connected to the SDRAM 8 via a decoder 7. A plurality of inputs of the decoder 7 correspond to a plurality pins of the SDRAM 8. The decoder 7 is configured to decode the value provided by the control module 2 and to trigger corresponding pin(s) of the SDRAM 8 according to the decoded value. Data and signals are transmitted among the components through the electrical connection. The related controlling operation is discussed in detail below.

In some embodiments, the SDRAM 8 is under a bus data access mode. In other words, the SDRAM 8 exchanges data with a device (e.g., a computer host) via a general bus. When special operation functions are required for SDRAM 8 (e.g., debugging, special command control, etc.), the controller 23 switches the SDRAM 8 from the bus data access mode to a DPIN operation mode based on user commands.

Under the DPIN operation mode, the user may use the controller 23 to set the values of the register 21A and the register 21B. Then, after completing the setting of the values of the register 21A and the register 21B, the controller 23 controls the SDRAM 8 according to the values of the register 21A and the register 21B. More specifically, when the users want to execute a special command using the SDRAM 8, such special command often corresponds to at least one pin of the SDRAM 8. In other words, when at least one pin corresponding to the special command is triggered, the execution of the special command using the SDRAM 8 is completed. Since different values of registers 21 correspond to different pins or different pin combinations of the SDRAM 8, users may fill in corresponding values in the register 21A and the register 21B in advance with respect to the at least one pin that the special command corresponds to. In this way, after completing the setting of the values of the register 21A and the register 21B, the controller 23 can trigger pin(s) of the SDRAM 8 according to the values of the register 21A and the register 21B, so as to finish the execution of the special command using the SDRAM 8. Several illustrative examples are provided below to further elaborate on the technology of the present disclosure.

In some examples, the value of the register 21A corresponds to a pin (e.g., a reset pin RST, a clock enable pin CKE, an on-die termination pin ODT, and the like) associated with the tied command of the SDRAM 8. In this case, for at least one pin (excluding the CKE pin) of the SDRAM 8, the user can set a corresponding value in the register 21A using the controller 23. In other words, the value specified in the register 21A is configured to trigger the at least one pin (excluding the CKE pin) of the SDRAM 8 correspondingly. After completing the setting, the controller 23 controls the SDRAM 8 directly according to the value of the register 21A.

On the other hand, for at least one pin (including the CKE pin) of the SDRAM 8, the user can set a corresponding value in the register 21A using the controller 23. In other words, the value specified in the register 21A is configured to trigger the at least one pin (including the CKE pin) of the SDRAM 8 correspondingly. After completing the setting, the controller 23 triggers a DPIN operation to simultaneously control the SDRAM 8 according to the value of the register 21A and the value of the register 21B. In this example, the controller 23 triggers the DPIN operation to control the SDRAM 8 according to the value of the register 21A.

In some examples, the value of the register 21A corresponds to a pin (e.g., a reset pin RST, a clock enable pin CKE, an on-die termination pin ODT, and the like) associated with the tied command of the SDRAM 8, and the value of the register 21B corresponds to a pin (e.g., a CS, RAS, CAS, WEN, ACT, or CA pin) associated with the synchronization command of the SDRAM 8. In this case, for at least one pin (excluding the CKE, RST, and ODT pin) of the SDRAM 8, the user can set a corresponding value in the register 21A and the register 21B using the controller 23. In other words, the values specified in the register 21A and the register 21B are configured to trigger the at least one pin (excluding the CKE, RST, and ODT pin) of the SDRAM 8 correspondingly. After completing the setting, the controller 23 controls the SDRAM 8 directly according to the value of the register 21A and the register 21B, and triggers the DPIN operation to control the SDRAM 8 according to the value of the register 21B.

On the other hand, for at least one pin (including the CKE, RST, and ODT pin) of the SDRAM 8, the user can set a corresponding value in the register 21A and the register 21B using the controller 23. In other words, the values specified in the register 21A and the register 21B are configured to trigger the at least one pin (including the CKE, RST, and ODT pin) of the SDRAM 8 correspondingly. After completing the setting, the controller 23 triggers a DPIN operation to simultaneously control the SDRAM 8 according to the value of the register 21A and the value of the register 21B. In this example, the controller 23 triggers the DPIN operation to control the SDRAM 8 according to the value of the register 21A and the value of the register 21B.

In some examples, the value of the register 21A corresponds to a pin (e.g., a reset pin RST, a clock enable pin CKE, an on-die termination pin ODT, and the like) associated with the tied command of the SDRAM 8, the value of the register 21B corresponds to a pin (e.g., a CS, RAS, CAS, WEN, ACT, or CA pin) associated with the synchronization command of the SDRAM 8, and the value of the register 21C corresponds to the data to be written into the SDRAM 8.

For at least one pin (excluding the CKE, RST, and ODT pin) of the SDRAM 8, the user can set a corresponding value in the register 21A, the register 21B, and the register 21C using the controller 23. In other words, the values specified in the register 21A and the register 21B are configured to trigger the at least one pin (excluding the CKE, RST, and ODT pin) of the SDRAM 8 correspondingly, and the value set in the register 21C is the data to be written into the SDRAM 8. After the completion of the setting, the controller 23 controls the SDRAM 8 directly according to the value of the register 21A and triggers the DPIN operation to control the SDRAM 8 according to the value of the register 21B and write the value of the register 21C into the SDRAM 8.

On the other hand, for at least one pin (including the CKE, RST, and ODT pin) of the SDRAM 8, the user can set a corresponding value in the register 21A, the register 21B, and the register 21C using the controller 23. In other words, the values specified in the register 21A and the register 21B are configured to trigger the at least one pin (including the CKE, RST, and ODT pin) of the SDRAM 8 correspondingly, and the value set in the register 21C is the data to be written into the SDRAM 8. After completing the setting, the controller 23 triggers a DPIN operation to simultaneously control the SDRAM 8 according to the value of the register 21A and the value of the register 21B and write the value of the register 21C into the SDRAM 8. In this example, the controller 23 triggers the DPIN operation to control the SDRAM 8 according to the value of the register 21A and the value of the register 21B.

In some examples, the value of the register 21A corresponds to a pin (e.g., a reset pin RST, a clock enable pin CKE, an on-die termination pin ODT, and the like) associated with the tied command of the SDRAM 8, the value of the register 21B corresponds to a pin (e.g., a CS, RAS, CAS, WEN, ACT, or CA pin) associated with the synchronization command of the SDRAM 8, and the value of the register 21C corresponds to the data to be written into the SDRAM 8.

For at least one pin (excluding the CKE, RST, and ODT pin) of the SDRAM 8, the user can set a corresponding value in the register 21A and the register 21B using the controller 23. In other words, the values specified in the register 21A and the register 21B are configured to trigger the at least one pin (excluding the CKE, RST, and ODT pin) of the SDRAM 8 correspondingly. After the completion of the setting, the controller 23 controls the SDRAM 8 directly according to the value of the register 21A and triggers the DPIN operation to control the SDRAM 8 according to the value of the register 21B and store the data read from the SDRAM 8 into the register 21D.

On the other hand, for at least one pin (including the CKE, RST, and ODT pin) of the SDRAM 8, the user can set a corresponding value in the register 21A and the register 21B using the controller 23. In other words, the values specified in the register 21A and the register 21B are configured to trigger the at least one pin (including the CKE, RST, and ODT pin) of the SDRAM 8 correspondingly. After completing the setting, the controller 23 triggers a DPIN operation to simultaneously control the SDRAM 8 according to the value of the register 21A and the value of the register 21B and store the data read from the SDRAM 8 into the register 21D. In this example, the controller 23 triggers the DPIN operation to control the SDRAM 8 according to the value of the register 21A and the value of the register 21B.

It should be noted that the above-mentioned DPIN operation can synchronize the access to the register 21A to register 21C; in some embodiments, additional synchronization control registers can be used to determine the execution of the above-mentioned DPIN operation. Please refer to FIG. 2B, which is another block diagram illustrating a control module 2 according to some embodiments of the present disclosure. The control module 2 further includes a synchronization control register 21E, which is configured to (1) label whether the SDRAM 8 is switched to the DPIN operation mode; (2) synchronize the access to the register 21A to register 21C; and (3) label the DPIN status.

Figure 3:
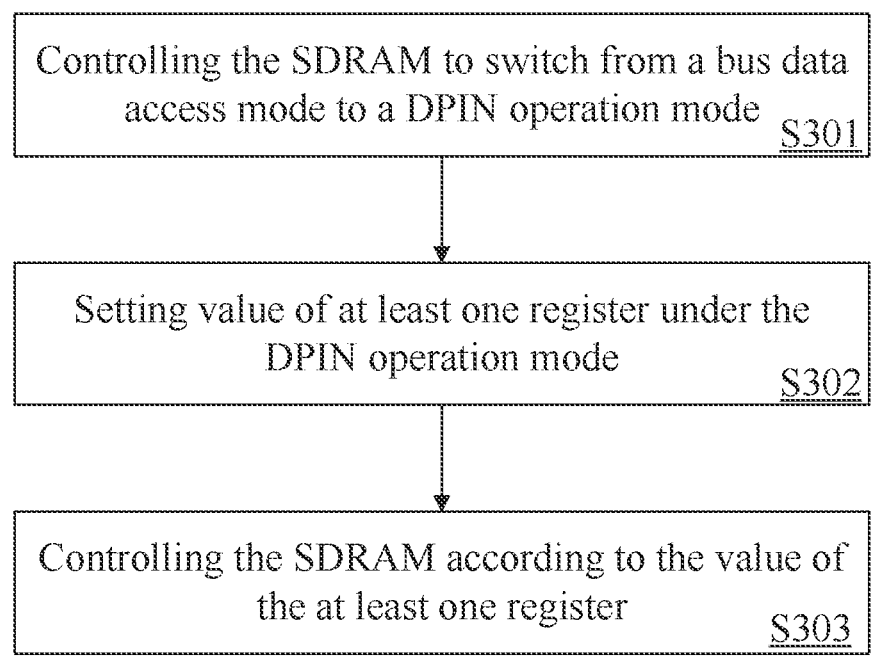
FIG. 3 is a flowchart of a control method of according to some embodiments of the present invention.

Some embodiments of the present disclosure include a control method for a SDRAM, and FIG. 3 is a flowchart illustrating the control method. The method of these embodiments is implemented using a control module (such as the control module described in embodiments above), and the detailed operation step of this method is described below. First, step S301 is executed to control the SDRAM to switch from a bus data access mode to a DPIN operation mode. Step S302 is executed to set value of at least one register under the DPIN operation mode. Step S303 is executed to control the SDRAM according to the value of the at least one register.

Figure 4:
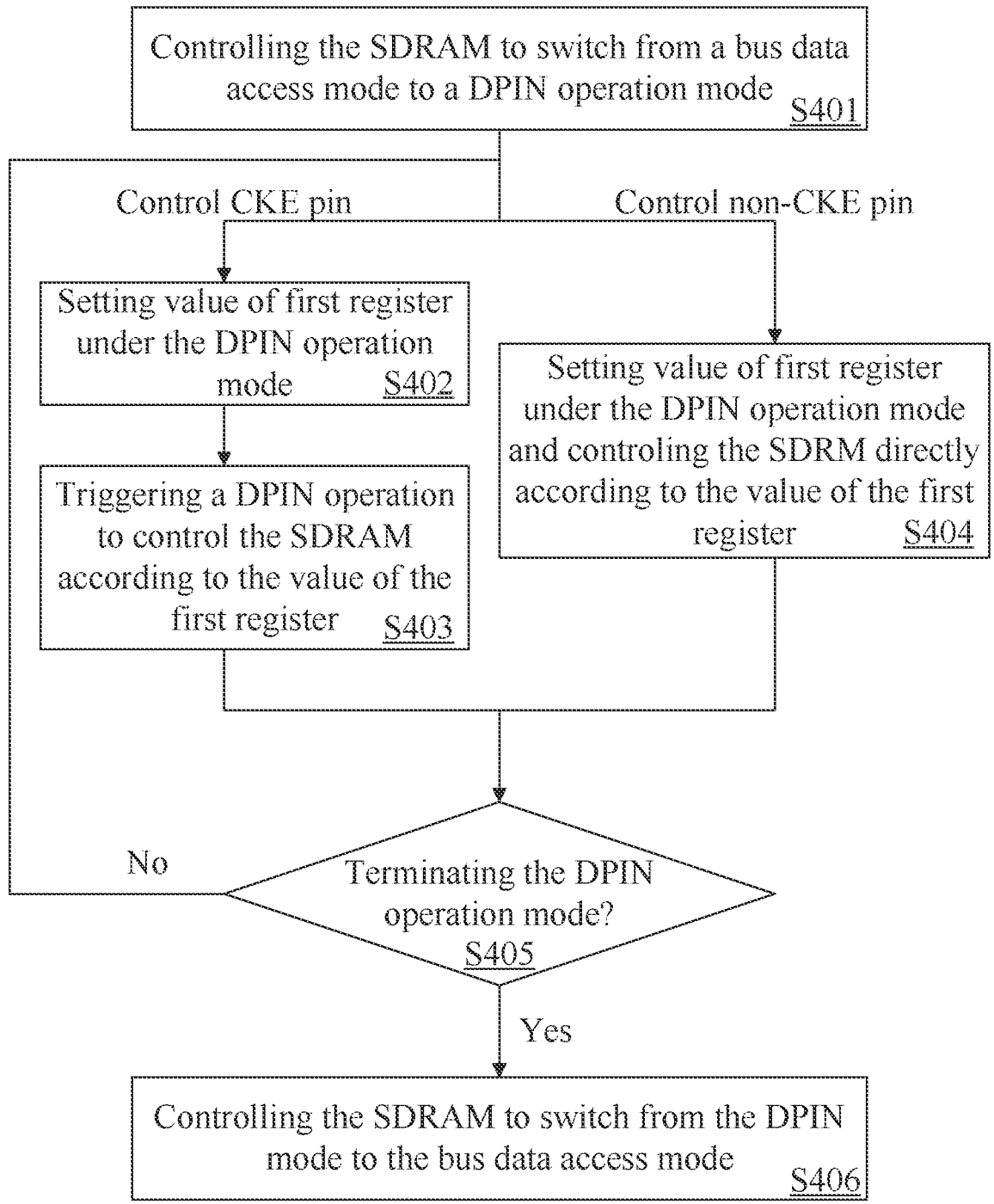
FIG. 4 is a flowchart of a control method of according to some embodiments of the present invention.

Some embodiments of the present disclosure include a control method for a SDRAM, and FIG. 4 is a flowchart illustrating the control method. The method of these embodiments is implemented using a control module (such as the control module described in embodiments above), and the detailed operation step of this method is described below.

First, step S401 is executed to control the SDRAM to switch from a bus data access mode to a DPIN operation mode. When it is desired to control a CKE pin of the SDRAM, step S402 is executed to set value of a first register under the DPIN operation mode so that the value of the first register corresponds to the at least one pin (including CKE pin) associated with the tied command of the SDRAM. Step S403 is executed to trigger a DPIN operation to control the SDRAM according to the value of the first register.

On the other hand, when it is desired to control a non-CKE pin of the SDRAM, step S404 is executed to set the value of the first register under the DPIN operation mode so that the value of the first register corresponds to the at least one pin (excluding CKE pin) associated with the tied command of the SDRAM and control the SDRAM directly according to the value of the first register.

In some embodiments, step S405 is executed to confirm whether to terminate the DPIN operation mode. If yes, step S406 is executed to control the SDRAM to switch from the DPIN operation mode to the bus data access mode. If not, step S402 to step S405 are repeated.

Figure 5A:
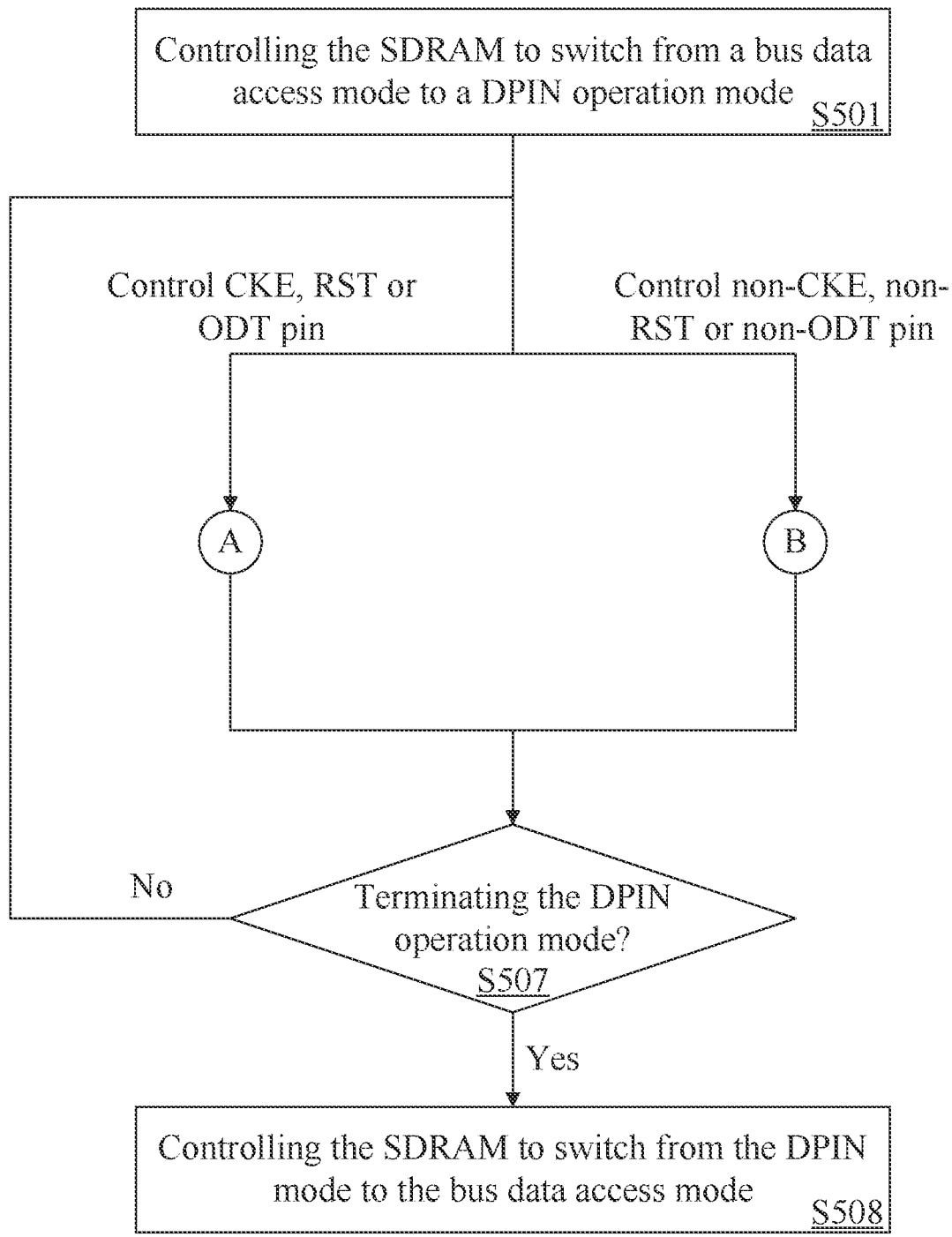
FIGS. 5A to 5C are flowcharts of a control method of according to some embodiments of the present invention.
Figure 5B:
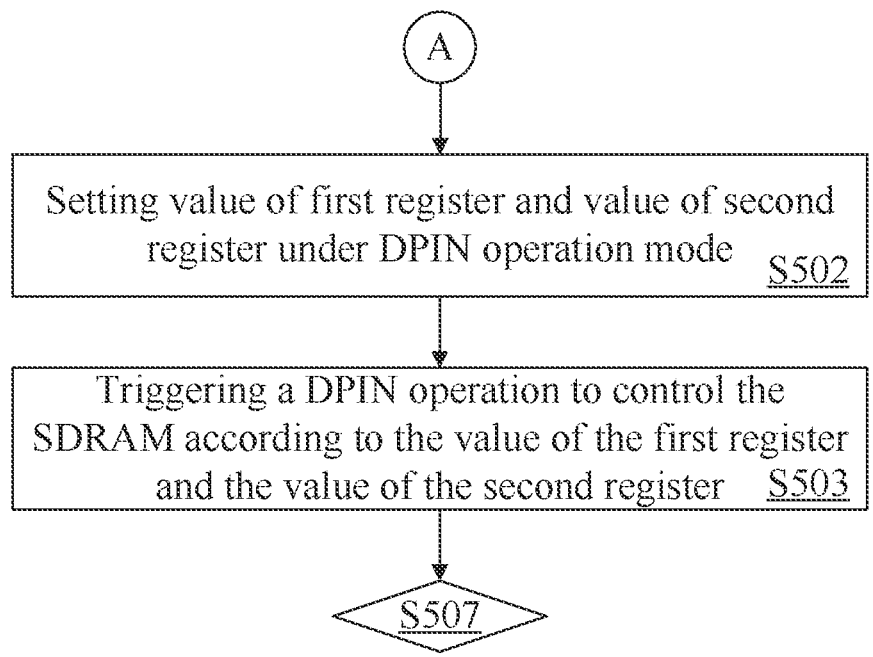
Figure 5C:
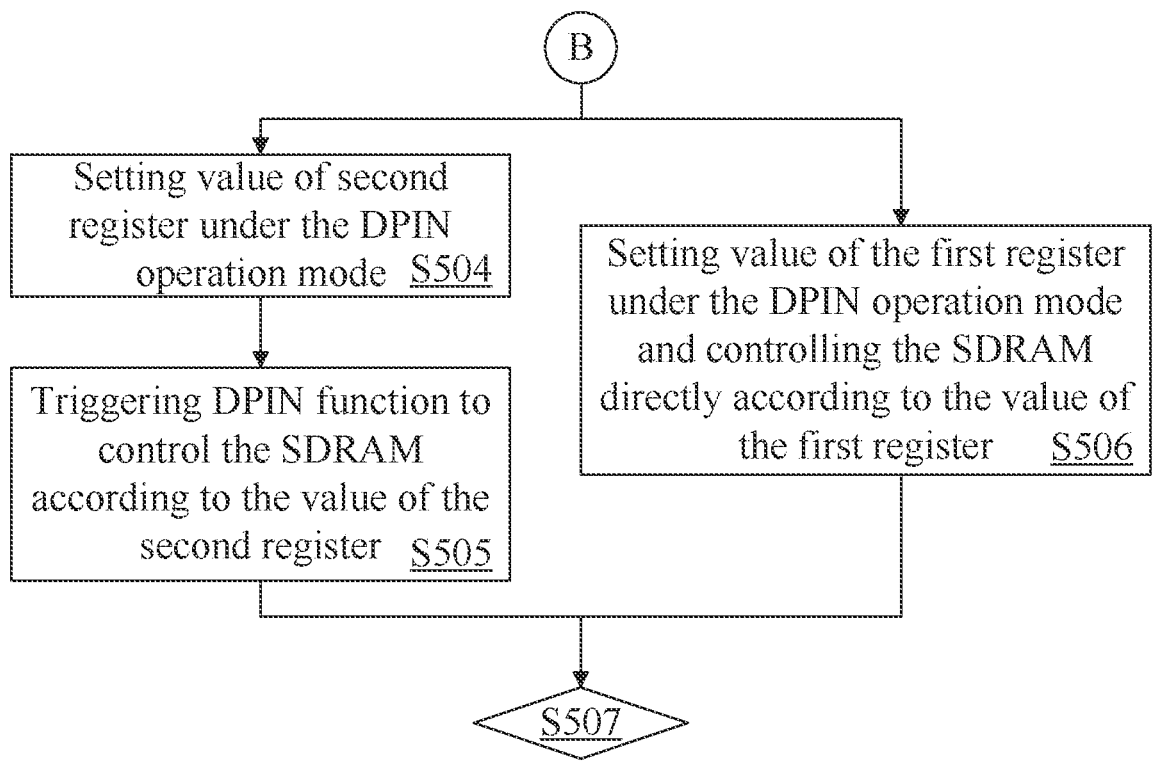

Some embodiments of the present disclosure include a control method for a SDRAM, and FIG. 5A to FIG. 5C are flowcharts illustrating the control method. The method of these embodiments is implemented using a control module (such as the control module described in embodiments above), and the detailed operation step of this method is described below.

First, step S501 is execute to control the SDRAM to switch from a bus data access mode to a DPIN operation mode. When it is desired to control the CKE, RST, or ODT pin of the SDRAM, step S502 is executed to set a value of a first register and a value of a second register under the DPIN operation mode so that the value of the first register corresponds to the at least one pin (including CKE, RST, and ODT pin) associated with the tied command of the SDRAM and the value of the second register corresponds to at least one pin (e.g., CS, RAS, CAS, WEN, ACT, and CA pin) associated with the synchronization command of the SDRAM's. Step S503 is executed to trigger a DPIN operation to control the SDRAM according to the value of the first register and the value of the second register.

On the other hand, when it is desired to control a non-CKE, non-RST, or non-ODT pin of the SDRAM, step S504 is executed to set the value of the second register under the DPIN operation mode so that the value of the second register corresponds to the at least one pin of the SDRAM. Step S505 is executed to trigger a DPIN function to control the SDRAM according to the value of the second register. It should be noted that step S506 can be executed simultaneously with step S504 and step S505 to set the value of the first register under the DPIN operation mode and to control the SDRAM directly according to the value of the first register.

In some embodiments, step S07 is executed to confirm whether to terminate the DPIN operation mode. If yes, then step S508 is executed to control the SDRAM to switch from the DPIN operation mode to the bus data access mode. If not, step S502 to step S506 are repeated.

Figure 6A:
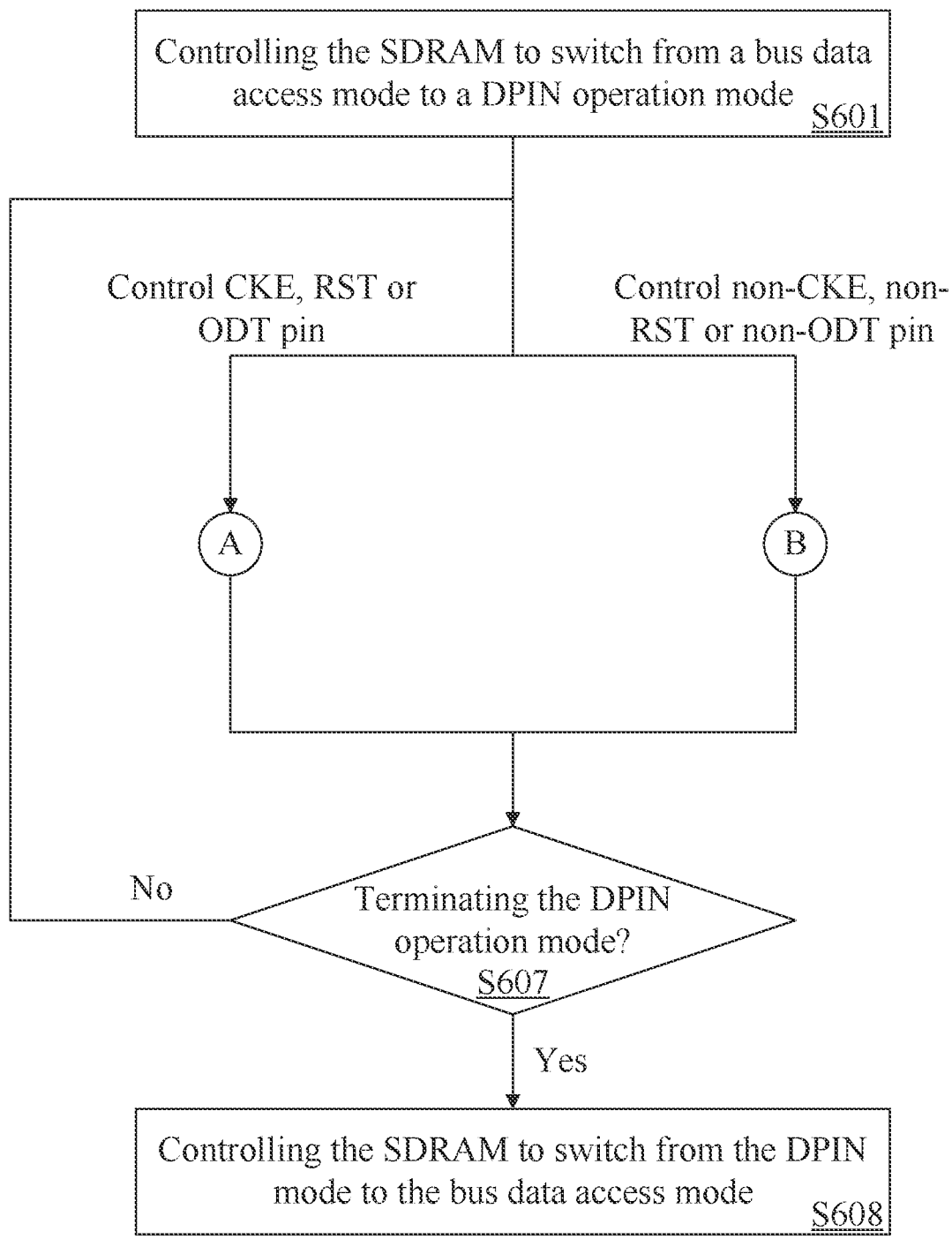
FIGS. 6A to 6C are flowcharts of a control method of according to some embodiments of the present invention.
Figure 6B:
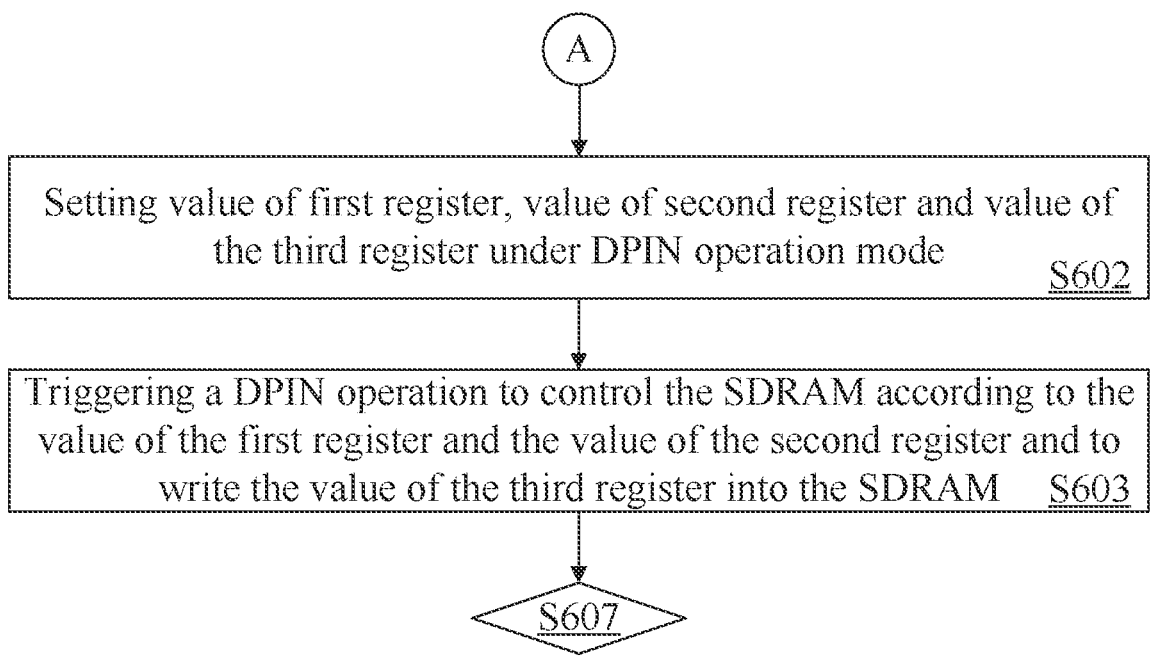
Figure 6C:
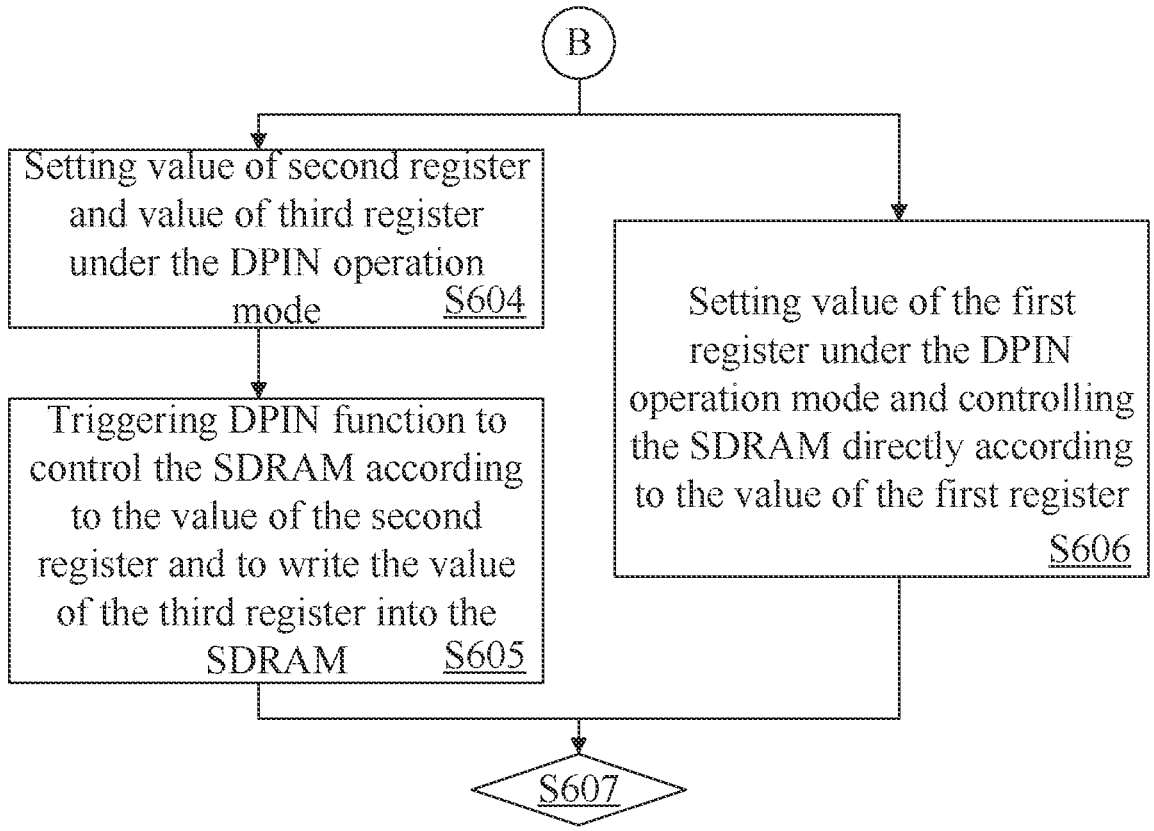

Some embodiments of the present disclosure include a control method for a SDRAM, and FIG. 6A to FIG. 6C are flowcharts illustrating the control method. The method of these embodiments is implemented using a control module (such as the control module described in embodiments above), and the detailed operation step of this method is described below.

First, step S601 is executed to control the SDRAM to switch from a bus data access mode to a DPIN operation mode. When it is desired to control the CKE, RST, or ODT pin of the SDRAM, step S602 is executed to set values of a first register, a second register, and a third register under the DPIN operation mode so that: (1) the value of the first register corresponds to at least one pin (including CKE, RST, and ODT pin) associated with the tied command of the SDRAM; (2) the value of the second register corresponds to at least one pin (e.g., CS, RAS, CAS, WEN, ACT, and CA pin) associated with the synchronization command of the SDRAM; and (3) the value of the third register corresponds to the data to be written into the SDRAM. Step S603 is executed to trigger a DPIN operation to control the SDRAM according to the value of the first register and the value of the second register and to write the value of the third register into the SDRAM.

On the other hand, when it is desired to control a non-CKE, non-RST, or non-ODT pin of the SDRAM, step S604 is executed to set the values of the second register and the third register under the DPIN operation mode so that the value of the second register corresponds to the at least one pin of the SDRAM and the value of the third register corresponds to the data to be written into the SDRAM. Step S605 is executed to trigger a DPIN function to control the SDRAM according to the value of the second register and to write the value of the third register into the SDRAM. It should be noted that step S606 can be executed simultaneously with step S604 and step S605 to set the value of the first register under the DPIN operation mode and control the SDRAM directly according to the value of the first register.

In some embodiments, step S607 is executed to confirm whether to terminate the DPIN operation mode. If yes, then step S608 is executed to control the SDRAM to switch from the DPIN operation mode to the bus data access mode. If not, step S602 to step S606 are repeated.

Figure 7A:
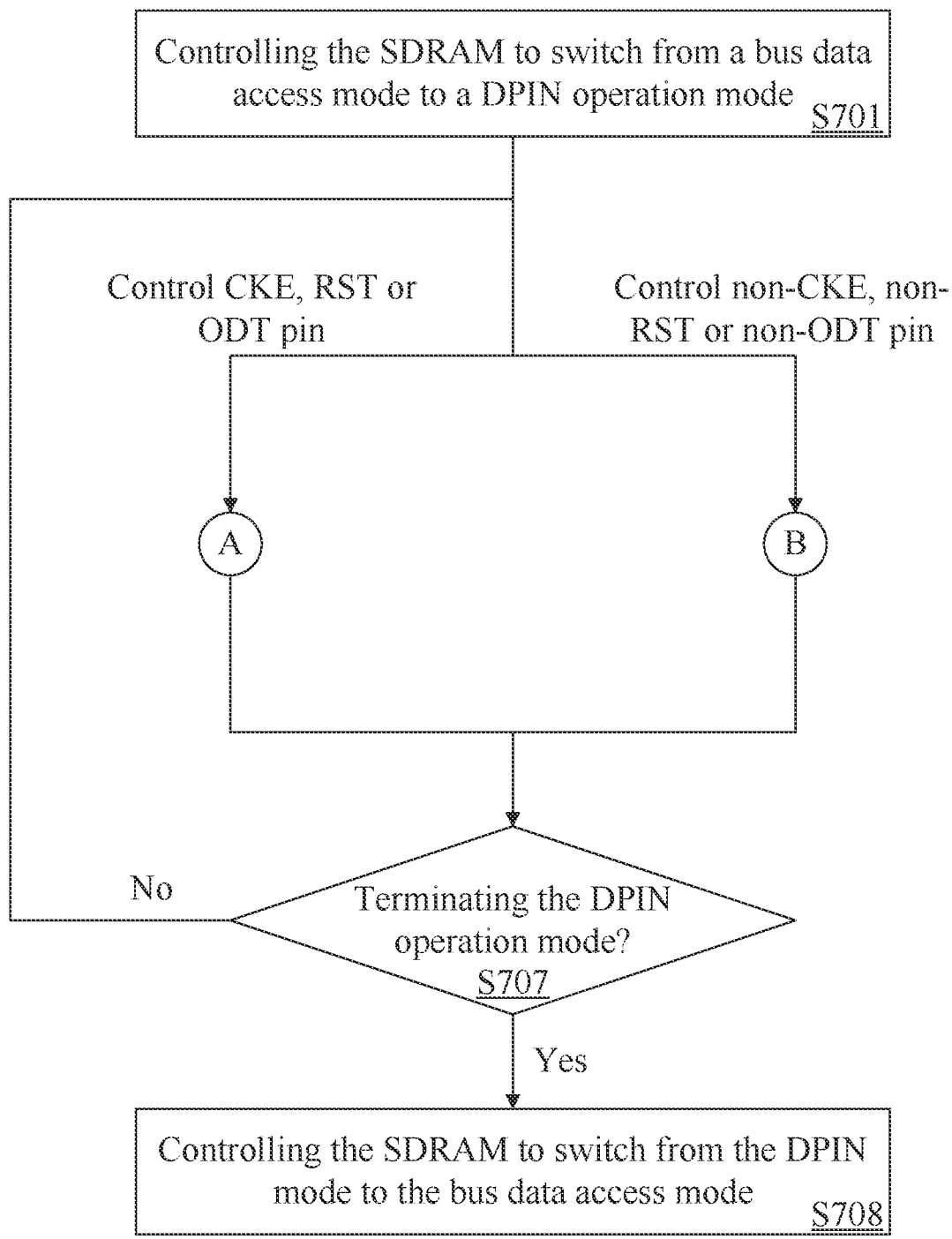
FIGS. 7A to 7C are flowcharts of a control method of according to some embodiments of the present invention.
Figure 7B:
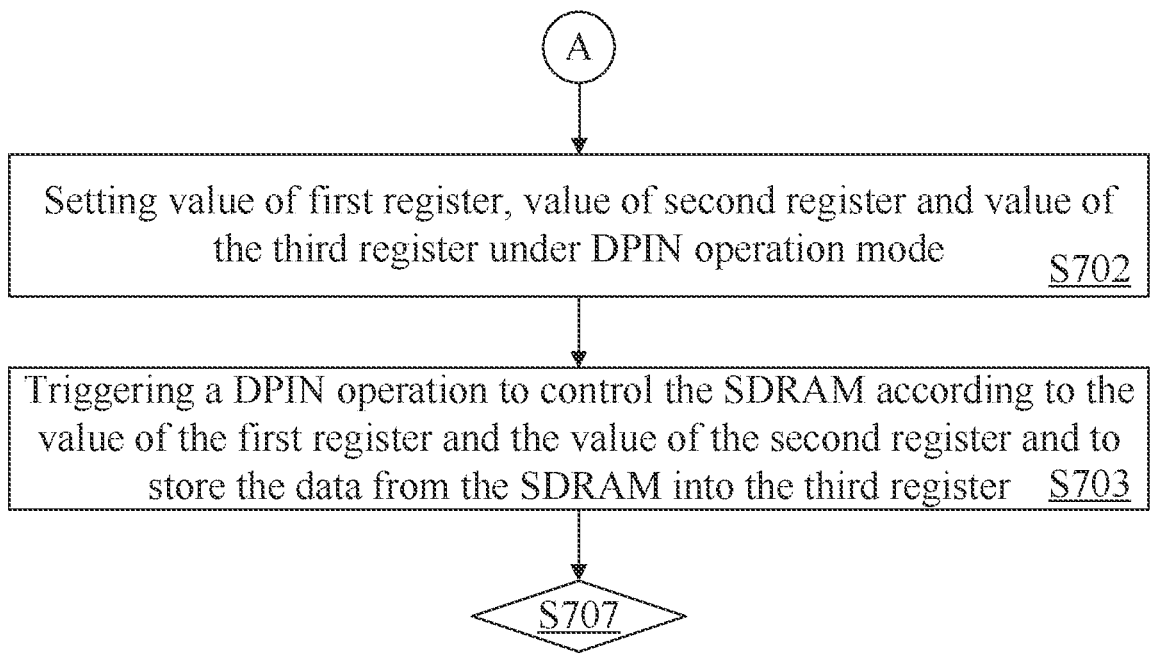
Figure 7C:
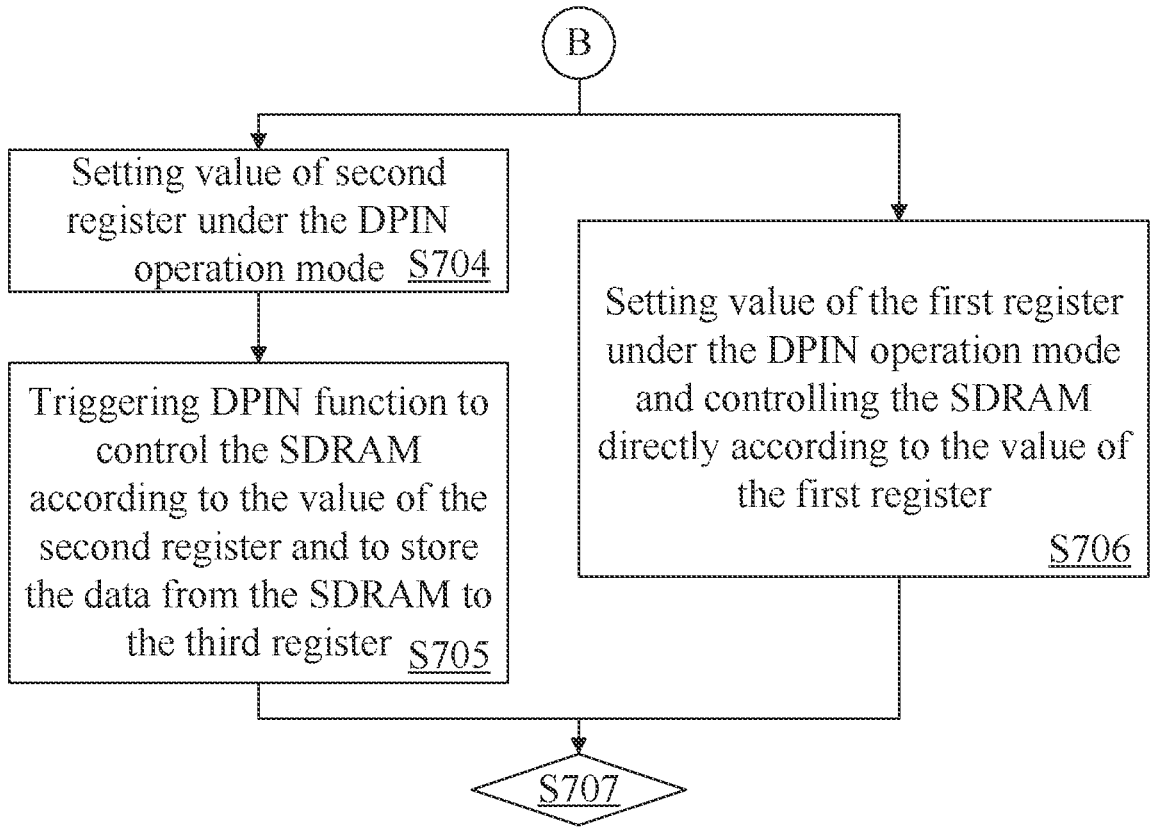

Some embodiments of the present disclosure include a control method for a SDRAM, and FIG. 7A to FIG. 7C are flowcharts illustrating the control method. The method of these embodiments is implemented using a control module (such as the control module described in embodiments above), and the detailed operation step of this method is described below.

First, step S701 is executed to control the SDRAM to switch from a bus data access mode to a DPIN operation mode. When it is desired to control the CKE, RST, or ODT pin of the SDRAM, step S702 is executed to set values of a first register and a second register under the DPIN operation mode so that the value of the first register corresponds to at least one pin (including CKE, RST, and ODT pin) associated with the tied command of the SDRAM, and the value of the second register corresponds to at least one pin (e.g., CS, RAS, CAS, WEN, ACT, and CA pin) associated with the synchronization command of the SDRAM. Step S703 is executed to trigger a DPIN operation to control the SDRAM according to the value of the first register value and the value of the second register and to store the data from the SDRAM into the third register.

On the other hand, when it is desired to control a non-CKE, non-RST, or non-ODT pin of the SDRAM, step S704 is executed to set the values of the second register and the third register under the DPIN operation mode so that the value of the second register corresponds to the at least one pin of the SDRAM. Step S705 is executed to trigger a DPIN function to control the SDRAM to store the data from the SDRAM into the third register according to the value of the second register. It should be noted that step S706 can be executed simultaneously with step S704 and step S705 to set the value of the first register under the DPIN operation mode and to control the SDRAM directly according to the value of the first register.

In some embodiments, step S707 is executed to confirm whether to terminate the DPIN operation mode. If yes, then step S708 is executed to control the SDRAM to switch from the DPIN operation mode to the bus data access mode. If not, step S702 to step S706 are repeated.

In view of the foregoing, the present disclosure provides control modules for use in the SDRAM and methods for controlling the same; these control modules and controlling methods control the SDRAM using additional registers and control circuits to validate or correct the defects, flaws, or errors of the SDRAM's operation design (particularly, operations with special functions). It should be noted that in some embodiments, the controller includes logic circuits for executing operations and commands; however, the implementation of the hardware components of the present disclosure is not limited thereto.

While this invention has been described with specific embodiments thereof, it is evident that many alternatives, modifications, and variations may be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the invention by simply employing the elements of the independent claims. Accordingly, embodiments of the invention as set forth herein are intended to be illustrative, not limiting. Various changes may be made without departing from the spirit and scope of the invention.

What is claimed is:

1. A control method for a synchronous dynamic random access memory (SDRAM), comprising:
controlling the SDRAM to switch from a bus data access mode to a dynamic pin (DPIN) operation mode;
setting a value of at least one register under the DPIN operation mode; and
triggering a DPIN operation based on a value of a synchronization control register to synchronize access to the at least one register and control the SDRAM according to the value of the at least one register.

2. The control method of claim 1, wherein the at least one register comprises a first register, the value of the first register corresponds to a clock enable pin associated with a tied command of the SDRAM, and the step of controlling the SDRAM according to the value of the at least one register further comprises:
triggering the DPIN operation to control the SDRAM according to the value of the first register.

3. The control method of claim 1, wherein the at least one register comprises a first register and a second register, the value of the first register corresponds to a clock enable pin, a reset pin, and an on-die termination pin associated with a tied command of the SDRAM, the value of the second register corresponds to a pin associated with a synchronization command of the SDRAM, and the step of controlling the SDRAM according to the value of the at least one register further comprises:
    triggering the DPIN operation to control the SDRAM according to the value of the value of the first register and the value of the second register.

4. The control method claim 3, wherein the at least one register further comprises a third register, and the step of triggering the DPIN operation further comprises:
    triggering the DPIN operation to control the SDRAM according to the value of the first register and the value of the second register and to write the value of the third register into the SDRAM.

5. The control method of claim 3, wherein the at least one register further comprises a third register, and the step of triggering the DPIN operation further comprises:
    triggering the DPIN operation to control the SDRAM according to the value of the first register and the value of the second register and to store the value read from the SDRAM into the third register.

6. The control method of claim 1, wherein the at least one register comprises a first register and a second register, the value of the first register corresponds to at least one pin associated with a tied command of the SDRAM, the at least one pin does not comprise a clock enable pin, a reset pin, and an on-die termination pin, the value of the second register corresponds to a pin associated with a synchronization command of the SDRAM, and the step of controlling the SDRAM according to the value of the at least one register further comprises:
    triggering the DPIN operation to control the SDRAM according to the value of the second register.

7. The control method of claim 6, wherein the at least one register further comprises a third register, and the step of triggering the DPIN operation further comprises:
    triggering the DPIN operation to control the SDRAM according to the value of the second register and to write the value of the third register into the SDRAM.

8. The control method of claim 6, wherein the at least one register further comprises a third register, and the step of triggering the DPIN operation further comprises:
    triggering the DPIN operation to control the SDRAM according to the value of the second register and to store the value read from the SDRAM into the third register.

9. A control module for use in a synchronous dynamic random access memory (SDRAM), comprising:
    at least one register, electrically connected to the SDRAM;
    a controller, electrically connected to the SDRAM and the at least one register and configured to:
        control the SDRAM to switch from a bus data access mode to a dynamic pin (DPIN) operation mode;
        set a value of at least one register under the DPIN operation mode; and
        trigger a DPIN operation based on a value of a synchronization control register to synchronize access to the at least one register and control the SDRAM according to the value of the at least one register.

10. The control module of claim 9, wherein the at least one register comprises a first register, the value of the first register corresponds to a clock enable pin associated with a tied command of the SDRAM, and the controller is further configured to:
    trigger the DPIN operation to control the SDRAM according to the value of the first register.

11. The control module of claim 9, wherein the at least one register comprises a first register and a second register, the value of the first register corresponds to a clock enable pin, a reset pin, and an on-die termination pin associated with a tied command of the SDRAM, the value of the second register corresponds to a pin associated with a synchronization command of the SDRAM, and the controller is further configured to:
    trigger the DPIN operation to control the SDRAM according to the value of the value of the first register and the value of the second register.

12. The control module of claim 11, wherein the at least one register further comprises a third register, and the controller is further configured to:
    trigger the DPIN operation to write the value of the third register into the SDRAM.

13. The control module of claim 11, wherein the at least one register further comprises a third register, and the controller is further configured to:
    trigger the DPIN operation to store the value read from the SDRAM into the third register.

14. The control module of claim 9, wherein the at least one register comprises a first register and a second register, the value of the first register corresponds to at least one pin associated with a tied command of the SDRAM, the at least one pin does not comprise a clock enable pin, a reset pin, and an on-die termination pin, the value of the second register corresponds to a pin associated with a synchronization command of the SDRAM, and the controller is further configured to:
    trigger the DPIN operation to control the SDRAM according to the value of the second register.

15. The control module of claim 14, wherein the at least one register further comprises a third register, and the controller is further configured to:
    trigger the DPIN operation to write the value of the third register into the SDRAM.

16. The control module of claim 14, wherein the at least one register further comprises a third register, and the controller is further configured to:
    trigger the DPIN operation to store the value read from the SDRAM into the third register.

* * * * *